(12) United States Patent
Loisel et al.

(10) Patent No.: US 8,581,251 B2
(45) Date of Patent: Nov. 12, 2013

(54) DEVICE FOR PROTECTING AN ELECTRONIC INTEGRATED CIRCUIT HOUSING AGAINST PHYSICAL OR CHEMICAL INGRESSION

(75) Inventors: Yann Yves René Loisel, La Ciotat (FR); Renaud Guigue, Fuveau (FR); Christophe Jean Tremlet, Aubagne (FR)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/130,534

(22) PCT Filed: Nov. 14, 2009

(86) PCT No.: PCT/FR2009/001307
§ 371 (c)(1),
(2), (4) Date: Jun. 29, 2011

(87) PCT Pub. No.: WO2010/058094
PCT Pub. Date: May 27, 2010

(65) Prior Publication Data
US 2011/0260162 A1    Oct. 27, 2011

(30) Foreign Application Priority Data
Nov. 21, 2008  (FR) ...................... 08 06563

(51) Int. Cl.
*H01L 23/60*  (2006.01)
(52) U.S. Cl.
USPC ............ 257/48; 257/E29.324; 257/E29.166

(58) Field of Classification Search
USPC .................... 257/48, E29.324, E29.166
See application file for complete search history.

(56) References Cited

U.S. PATENT DOCUMENTS

| 5,159,629 | A  | * | 10/1992 | Double et al. ............... 713/194 |
| 6,708,274 | B2 |   | 3/2004  | Herbert et al. |
| 6,957,345 | B2 | * | 10/2005 | Cesana et al. ............... 713/194 |
| 7,106,091 | B2 | * | 9/2006  | Gammel ......................... 326/8 |
| 7,529,999 | B2 | * | 5/2009  | Janke et al. .................. 714/734 |
| 2001/0056542 | A1 | * | 12/2001 | Cesana et al. ............... 713/194 |

(Continued)

FOREIGN PATENT DOCUMENTS

| EP | 2026470 A1 | 2/2009 |
| FR | 2801999 A1 | 6/2001 |

(Continued)

OTHER PUBLICATIONS

International Search Report and Written Opinion for PCT Application No. PCT/FR2009/001307, mailed on Mar. 10, 2010; 6 pages.

(Continued)

*Primary Examiner* — Chuong A Luu
*Assistant Examiner* — Jaehwan Oh
(74) *Attorney, Agent, or Firm* — North Weber & Baugh LLP

(57) ABSTRACT

The invention relates to the creation of a housing for an integrated circuit which makes it possible to detect physical ingression into said housing. The invention applies in particular to the protection of secrets which may possibly be contained in said integrated circuit, in the event of physical attack, for example by destroying the secrets contained in an integrated circuit in the event of ingression into the housing thereof.

9 Claims, 2 Drawing Sheets

(56) References Cited

U.S. PATENT DOCUMENTS

| | | |
|---|---|---|
| 2003/0084285 A1* | 5/2003 | Cromer et al. ............... 713/164 |
| 2003/0200448 A1 | 10/2003 | Foster et al. |
| 2003/0218475 A1* | 11/2003 | Gammel ........................... 326/8 |
| 2007/0079202 A1* | 4/2007 | Janke et al. ................... 714/733 |
| 2007/0121575 A1 | 5/2007 | Savry et al. |
| 2008/0278217 A1* | 11/2008 | Hankhofer et al. ........... 327/509 |
| 2009/0144834 A1* | 6/2009 | Mochizuki et al. ............. 726/27 |
| 2010/0037325 A1* | 2/2010 | Westerinen et al. ............ 726/34 |

FOREIGN PATENT DOCUMENTS

| | | |
|---|---|---|
| FR | 2864667 A1 | 7/2005 |
| FR | 2872610 A1 | 1/2006 |
| FR | 2864667 B1 | 2/2006 |
| FR | 2888975 A1 | 1/2007 |
| FR | 2872610 B1 | 6/2007 |
| FR | 2888975 B1 | 9/2007 |
| GB | 2363233 A | 12/2001 |
| GB | 2363233 B | 3/2004 |

OTHER PUBLICATIONS

French Search Report for French Patent Application No. 1154694, mailed on Jan. 27, 2012; 7 pages.

Chinese Search Report for Chinese Patent Application No. 200980146866.0, mailed on Apr. 27, 2013; 15 pages.

* cited by examiner

DEVICE FOR PROTECTING AN ELECTRONIC INTEGRATED CIRCUIT HOUSING AGAINST PHYSICAL OR CHEMICAL INGRESSION

CROSS REFERENCE TO RELATED APPLICATIONS

This application is the National Phase Application under 35 USC §371 of International Application No. PCT/FR2009/001307, filed Nov. 4, 2009, which claims priority to French Patent Application 0806563, filed Nov. 21, 2008.

BACKGROUND

A. Technical Field

The present invention generally relates to secure integrated circuits and more particularly to secure microcontrollers.

B. Background of the Invention

Several types of integrated circuit exist which are dedicated to the security of information, and it is nowadays common to base the security of an electronic system or computer system on an integrated circuit which performs the security functions.

One well-known example is that of the chip card, which is provided with an integrated circuit having the function of protecting sensitive information such as keys. These keys secure for example bank transactions, telephone charges or distance purchase transactions.

However, integrated circuits for chip cards have only a single input/output pin. It is therefore easy to encrypt the data circulating on this pin, so that it is not useful to secure the housing as such.

Another example of a circuit dedicated to security is the TPM ("Trusted Platform Module") which, on the initiative of large computer companies, is nowadays present on almost all professional laptops, and these TPMs will tomorrow probably equip all personal computers sold throughout the world.

Complex secure circuits, in particular TPM circuits, have a much larger number of inputs/outputs than a circuit for a chip card (28 pins for the TPM). Thus, the securing of the component requires the protection of the sensitive information circulating on this multitude of inputs/outputs, so that an attacker cannot obtain information or force said information to the values that he desires. It can therefore be seen that the encryption solution which is suitable in the case of circuits for chip cards is no longer suitable in the case of complex secure circuits, since the computing power necessary for encrypting and decrypting in real time around 20 signals or even more would be crippling in terms of the necessary performance and cost.

A new solution is therefore required for securing complex circuits provided with a multitude of inputs/outputs.

Furthermore, it has been noted that devices for the physical and electrical analysis of integrated circuits progress rapidly. These devices include in particular the electron scanning microscope, focalized ion beam (FIB) devices or devices for analyzing the emission of photons by the junctions (also known as "Emiscopes").

These items of equipment, which are basically intended for the development of integrated circuits, can also be used by some people as formidable means of attack directed against the security of circuits.

However, in this context, it is important to note that, for all these devices, the housing must be opened before carrying out the attack.

One way of responding to the problem would therefore consist in principle of protecting the whole of the circuit, by protecting the housing of the circuit against physical ingressions. The protection of the housing may be relatively simple in some cases, for example by depositing a resin coating on top of the integrated circuit, for packagings of the "Chip on Board" type or when the secure components are chip card micromodules.

This is what was done in FR 2 888 975 A, which provides for covering the entire surface of the chip with protective layers which are arranged on each side of the chip so as to cover the entirety thereof with a protective layer. Of course, such a structure is expensive in view of the surface area to be protected. In addition, it is relatively ineffective since all that is required is to remove the protective layers, which are clearly located and very apparent, in order to bypass the protection means.

However, such a protection is ineffective because a simple chemical attack makes it possible to remove the resin coating deposited at the time of placing the circuit on the support and to access the actual integrated circuit (chip).

The protection of the housing against physical ingressions is more complex in other implementations if the integrator has provided additional protection during the final mounting of the integrated circuit on its support. For example, it is known to cover the circuit with a deposit, a cap or a cover of variable type (resin deposit, metal cap). The latter may be very simple, thus providing minimal mechanical protection since the protection is merely passive.

Also known are more elaborate means of external protection, in the form of conductive circuits in which there is conveyed an electrical signal intended to detect any ingression into the cover by a checking of this signal by the security mechanisms, the conductive circuits generally being arranged in a material preventing access thereto (resin, gel, etc.). One highly representative example of such a coating which provides a high level of security is the product called "tamper-respondent security enclosure" by WL Gore & Associates. However, this external protection option presents considerable drawbacks for the person integrating the circuit in the final product. In fact:

the integration of the component thus protected is by definition more complicated to achieve since it requires additional elements, such as for example a cap, additional tooling for installing the cap, additional time for mounting the cap and drying the resin;

the manufacturing cost is higher due to the additional material required and the additional manufacturing steps;

there is a negative impact on the manufacturing yield of the final product;

the risk is higher from a security point of view since functional modifications on the final product may involve rethinking this protection;

the external protection must be validated by certifying laboratories.

DEFINITIONS

With regard to vocabulary, the chip denotes the actual integrated circuit, which is cut from a silicon wafer.

The substrate denotes a mini PCB ("Printed Circuit Board"), enabling the connection between the external connections or studs and the "chip" itself.

The component denotes the assembly consisting of the substrate, the chip and the housing covering it all.

The printed circuit board PCB denotes the electronic board on which the component is placed.

The chip is usually deposited on the substrate (except in the case of so-called "flip-chip" technology) during the operation known as "die attach" and is glued by means of a conductive epoxy glue.

The connection specifically between the substrate and the "chip" takes place in many ways, depending on the selected technologies. For example, in the conventional context, a wire connection is made which consists in connecting the substrate to the chip by means of conductive wires, the conductive wires resting on pads on the substrate side and on studs on the chip side. For the technology known as "flip-chip", the electrical connection between the chip and the substrate takes place by means of conductive balls which are welded underneath the component and on the substrate.

The electrical connection between the component and the printed circuit board (PCB) takes place in many ways depending on the selected technologies, for example via conductive balls on packaging known as BGA ("Ball Grid Array").

Thus, considering a non-flip-chip BGA chip, any signal, in particular a sensitive signal, coming from the printed circuit board PCB will pass via the balls, then through the substrate, via the studs, along the interconnecting wires, then the studs, in order to finally be conveyed into the chip.

SUMMARY OF THE INVENTION

One general aim of the invention is to propose a device and a method for protecting an integrated circuit housing, which is able to overcome the disadvantages of the protection systems known in the prior art.

Another, more specific aim of the invention is to propose a device for the simple and effective protection of integrated circuit housings, making it possible to detect any opening of the housing for access to a sensitive area of the integrated circuit.

Another aim of the invention is to propose a protection device which is inexpensive to produce.

The principle of the invention consists in arranging, in a certain pattern, a fragile element containing a conductive material, the fragile element being introduced in the continuity of an ingression detection circuit.

Contrary to the aforementioned document FR 2 888 975 A, therefore, the aim is to protect only the immediate surroundings of the sensitive areas, that is to say the areas likely to be used for the conveying of sensitive information. To this end, droplets or fragile areas of very small diameter are formed in the surroundings of the sensitive areas. These droplets are connected to one another by an electrical circuit arranged on the substrate or embedded in the substrate. The droplets are of very small size and are located in a manner that is unpredictable for an attacker, so that any mechanical or chemical ingression in the vicinity of a sensitive area will necessarily destroy one or more droplets or the circuit connecting the latter.

The detection circuit conducts a signal which makes it possible to verify the electrical continuity of the direction circuit. The signal used may be of multiple shapes, static or dynamic (i.e. constantly changing shape). The electrical continuity of the detection circuit is verified for example by comparing the input of said detection circuit and the output. The security policy decides consequences for this verification and for the potential detection of an ingression attempt, one possible consequence being for example the deletion of the keys stored in the integrated circuit.

In order to implement this principle, the invention relates to an electronic integrated circuit comprising an electronic chip attached to a substrate, the assembly being protected by a housing, the electronic chip being provided with input/output studs connected to linking pads arranged on the substrate, this circuit being further provided with at least one ingression detection means capable of detecting a mechanical and/or chemical ingression inside the housing and/or an attempt to access a sensitive area of the integrated circuit, characterized in that said ingression detection means comprises a detection circuit embedded in and/or placed on the substrate and arranged so as to pass in the immediate vicinity of some sensitive areas of the integrated circuit so that any attempt to access any one of said sensitive areas brings about a change in the electric state (closed/open) of said detection circuit.

To this end, the detection circuit comprises fragile areas, arranged in the immediate vicinity of said sensitive areas, so that any physical or chemical access in the vicinity of a sensitive area brings about destruction of the adjacent fragile area and detection of the ingression into the circuit.

Advantageously, the fragile areas are embodied in the form of droplets of conductive resin, arranged in the vicinity of said sensitive areas.

Preferably, the droplets of conductive resin have a size smaller than approximately 1000 micrometers and are spaced apart from the sensitive areas to be protected by a spacing of around 50 micrometers.

According to one embodiment of the invention, the fragile areas of the detection circuit are randomly distributed in or on the substrate of the integrated circuit.

As a variant embodiment, the fragile areas of the detection circuit are distributed in a conductive scatter pattern on the substrate, in particular in the form of a grid. Some joining points of the scatter pattern which are close to the sensitive areas are then raised to the surface of the substrate by conductive feedthroughs and provided with a fragile area.

According to one embodiment of the invention, the ingression detection circuit is arranged directly on the chip instead of the substrate or in addition to the substrate, the ingression detection circuit being connected to the input/output studs of the chip.

Advantageously, the detection circuit is embodied in the form of a circuit which is electrically open in the vicinity of the sensitive areas, so that a chemical attack by a conductive liquid brings about the closing of the circuit in the vicinity of the sensitive areas and consequently the detection of the chemical attack.

As a variant, the detection circuit is embodied in the form of a circuit which is electrically closed in the vicinity of the sensitive areas, so that a chemical attack by a conductive liquid brings about the opening of the circuit in the vicinity of the sensitive areas and consequently the detection of the chemical attack.

BRIEF DESCRIPTION OF THE DRAWINGS

The invention will be better understood on reading the following detailed description and the figures, in which.

FIG. ("FIG.") 1 shows in elevation and in cross-section the schematic conventional structure of an integrated circuit housing mounted on a substrate connected to a support.

FIG.

DETAILED DESCRIPTION OF THE PREFERRED EMBODIMENTS

Figure 1:
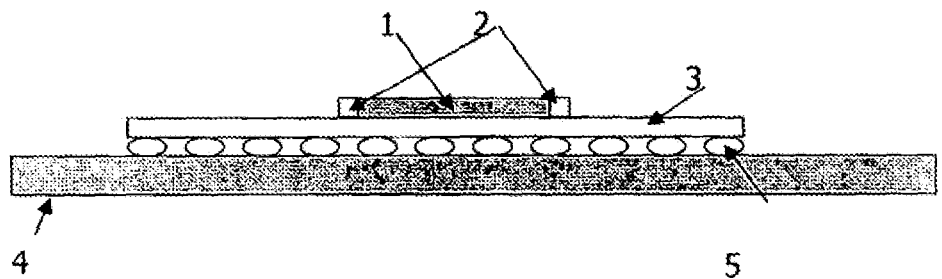

Reference is made to FIG. 1. This figure shows a single chip 1 obtained by cutting from a silicon wafer and comprising electrical studs or terminals 2 for electrically connecting the chip to the surrounding environment. The chip is attached to a substrate 3 (any type of insulating material), the latter being itself welded to a printed circuit board 4 by means of a matrix of balls BGA 5. The printed circuit board 4 comprises lands of suitable diameter (not shown). The spacing between the balls is generally in the mm range. The solder balls 5 form the electrical join between the studs 2 of the chip 1 and the conductive tracks of the printed circuit board 4.

Figure 2:
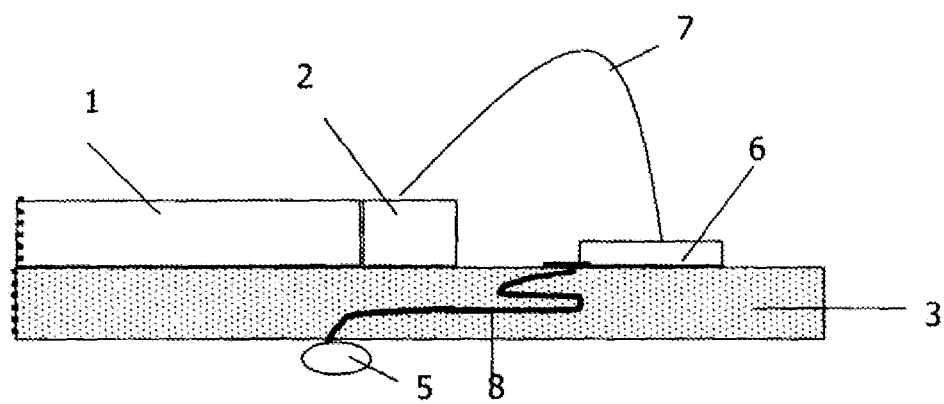
FIG. 2 shows a more detailed view in elevation and in cross-section of a chip mounted on a substrate with wired connection between the chip and the substrate by means of interconnection between the chip and the substrate by means of interconnections and linking pads.
Figure 3:
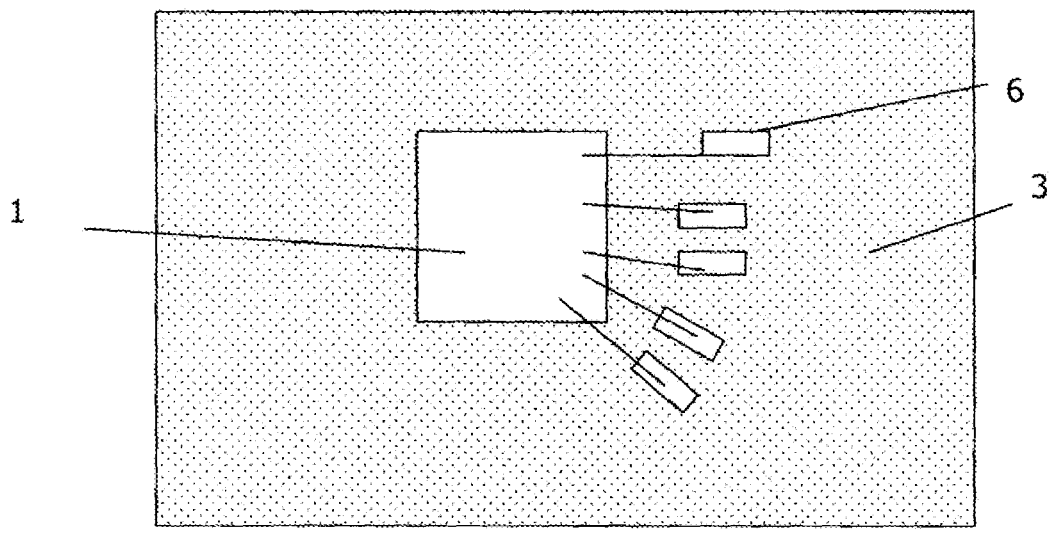
FIG. 3 shows the device of FIG. 2 in plain view.

As shown in greater detail in FIGS. 2 and 3, the studs 2 of the chip 1 are connected to pads 6 of the substrate 3 via conducting wires 7, typically made from gold or aluminum. In addition, the pads 6 are each connected to a ball 5 via a circuit 8 integrated in the substrate 3. Thus a signal conducted toward the linking pad 6 is then conveyed toward the corresponding ball 5 of the BGA by the circuit 8 present in the substrate.

Figure 4:
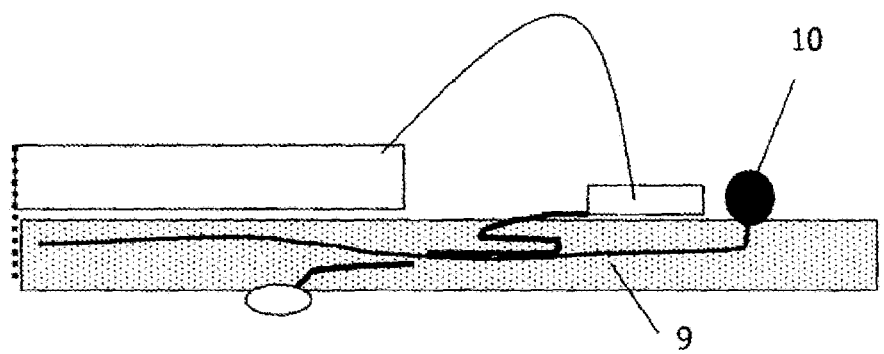
FIG. 4 shows a view in elevation and in cross-section similar to that of FIG. 2, but including an ingression detection circuit according to the invention.

Reference is made to FIG. 4 which shows a view in elevation and in cross-section similar to that of FIG. 2, but including an ingression detection circuit 9 provided according to the invention with fragile areas. The detection circuit 9 is embedded in the substrate 3 or placed thereon, or partially embedded in and partially placed on the substrate. This detection circuit 9, and in particular the part corresponding to the fragile element, has the task of ensuring the integrity and protection of sensitive elements on the component. These sensitive elements are in particular memories containing sensitive data, or other chips or circuits transporting sensitive signals.

The detection circuit 9 rises toward fragile elements, in particular embodied in the form of detection droplets 10, but of course other embodiments of fragile elements are within the capabilities of the person skilled in the art. The droplets are deposited on the surface of the substrate 3, close to those linking pads 6 which are considered to be sensitive, so that any physical or chemical attack on a sensitive area will result in destruction of the nearest fragile element, which would activate an alarm connected to the detection circuit.

Figure 5:
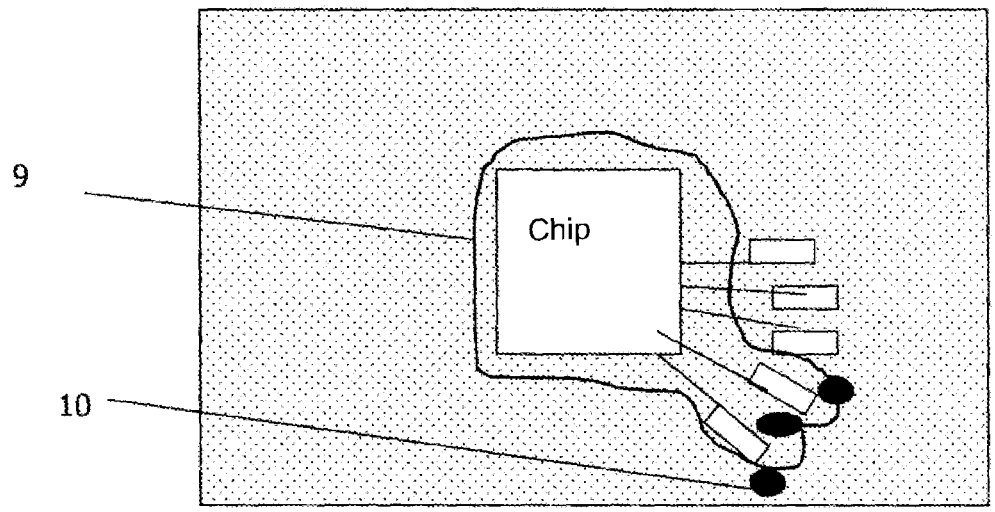
FIG. 5 shows the device of FIG. 4 in plan view.

As shown in FIG. 5, the detection circuit 9 connects the detection droplets to one another so that any attack on the circuit or on one of the detection droplets breaks the circuit 9, which generates an alert that can be used in order for example to destroy the secrets stored in the memory of the chip 1.

Preferably, the detection circuit 9 is embedded in internal layers of the substrate 3 and is therefore considered to be inaccessible. This circuit then "rises" to the surface of the substrate 3 via conductive feedthroughs (not shown). One droplet thus provides the connection between 2 feedthroughs and the set of droplets thus closes the detection circuit. It is clear than, in order to ensure good efficacy of detection of ingressions toward sensitive areas, the droplets 10 and the linking pads 6, as well as their interconnections, must be of as small a size as possible in view of the manufacturing cost requirements.

Thus, with the current technologies for forming circuits, the dimensions which can easily be attained are a diameter of around 500 μm for the droplets 10, around 200 μm for the linking pads 6 and around 35 μm for the interconnections of the wired detection circuit 9. In addition, the precision with which the droplets are deposited is around 25 μm and the distance between a droplet 10 and the nearest linking pad 6 that it protects is around 50 μm.

It should be noted that the product used for gluing the chip 1 onto the substrate 3 is generally deposited on the surface of the substrate by means of a syringe in droplets or patterns. This product is for example a conductive resin known by the trade name: "Ablestik Ablebond® epoxy 8290". This method of depositing droplets and this tooling can therefore be used also for depositing the droplets 10 of conductive resin on the substrate 3.

As mentioned above, the most sensitive areas of a component comprising a chip arranged on a substrate are protected by the proximity of fragile elements which are embodied for example in the form of droplets 10 of electrically conductive material. There will now be discussed some ways of obtaining the desired fragility, particularly in the event of a mechanical and/or chemical attack on the component.

The concept promises the protection principle that an attacker attempting to access the chip or a signal present on the substrate of the housing must, in order to do so, first of all chemically and/or mechanically remove an inert layer (typically the molding resin). It is this action of removing this inert layer that will expose it to the corruption of at least one fragile element, thus triggering detection of the attack.

With regard to introducing mechanical fragility, this is inherent when depositing fragile areas of small size, as is the case when depositing fine droplets 10. This is because the small size of the droplet makes the latter highly sensitive to any machining approach (for example by milling, drilling or the like) for accessing a sensitive element and any approach on this sensitive element will involve the highly probable tearing of the droplet.

With regard to introducing chemical fragility, it is possible to imagine for example that the chemical composition of a fragile element, typically the droplet 10, is similar to that of the housing, which would make it sensitive to chemical attacks which consist in destroying the housing of the component, this housing (not shown in the figures) incorporating and protecting the chip and its substrate.

Thus, a chemical attack on the housing will have consequences on the fragile element, destroying or degrading the latter at the same time as or even before dissolving the housing. This will result in a reaction of the detection circuit and detection of the attack.

Another solution, in the case where the chemical composition of the housing is not similar to that of the fragile element, consists in mixing a conductive version of the fragile element with an insulating version. One example of this type of implementation would consist in using a conductive epoxy resin and an insulating epoxy resin. Thus, an attempt to remove the insulating epoxy resin would have the result of also removing the conductive epoxy resin. The use of epoxy resin is a very interesting solution since the tools for depositing the resin (using needles) are tools which are already present and available on integrated circuit encapsulation lines.

One last means for making a chemical attack difficult involves limiting the aggressor in the choice of product for attacking the fragile element and/or the housing. This is because, when the chemical composition of the housing includes a lot of silica, organic solvents are ineffective. Under these conditions, therefore, it is only possible to use products such as fuming nitric acid, which is commonly used to destroy resins and thus to attack integrated circuits. Considering nitric acid, or any other acid which is sufficiently concentrated to ensure electrical conductivity, or any conductive solution, it is sufficient to provide in the housing a detection mechanism based on a circuit which is a priori not closed. Thus, due to the fluidity and conductivity of the attacking solution, the spreading of the conductive solution would have the effect of closing the detection circuit, which would signify an attack.

The fragile elements are deposited on an electrically insulated surface, apart from at the location of the connection points reserved for the fragile elements.

The location and/or scatter of the fragile elements may vary widely, depending on the levels of security to be defined on a case-by-case basis and on the most suitable technological choices for each case.

For example, each fragile element 10 may be located close to a sensitive area in order to protect it by proximity. For cases in which a wired interconnection is used, it is necessary to protect the linking pads which are the points of attachment to the substrate for the wires for connection to the chip. Thus the fragile element is deposited as close as possible to these linking pads. Ideally, the fragile element is in contact with the linking pad. It is therefore very difficult for a potential attacker to attempt to approach the linking pads without detection in order to attack said pads.

One scatter pattern for the fragile elements may therefore be a pattern which is usually called "mesh". This is a type of network which may be more or less closely knit, scattered over all or part of the substrate. This makes it possible to protect the signals conveyed in the substrate. The circuit thus formed makes it possible to detect any ingression by modification of the signal conducted in said circuit.

Another scatter pattern for the fragile elements consists in scattering small dots of fragile elements in a manner distributed over the substrate. For example, these may be distributed over the entire substrate, randomly, or over only a portion thereof if said portion is particularly sensitive and to be protected. For this pattern, most of the detection circuit will be embedded in the substrate and only a few points will be external, these consisting of the points at which the fragile elements such as conductive droplets are deposited. The circuit thus formed makes it possible to detect any ingression by modification of the signal conducted in the detection circuit.

A third example of embodiment consists in protecting not the substrate but rather the chip directly. The latter is usually covered with an insulating passivation layer. This makes it possible to deposit the conductive fragile element on the surface thereof. The connection of the detection circuit then takes place on the studs 2 of the chip. One very simple implementation consists in a connection between two consecutive studs. Such a detection circuit is thus able to protect a third sensitive stud, located in the vicinity of these two studs. The advantage of this type of manufacture is that the connection of the two studs by depositing the fragile element is easy to achieve. It is also possible to form passivation openings at any location on the surface of the chip, allowing a droplet deposition.

A fourth example of embodiment of the detection circuit consists in protecting the chip directly by exploiting the conductivity of the attacking liquid (for example fuming nitric acid) by analogy with the solution described above on the presence of a circuit which is a priori open and which would be closed by the fluidity and conductivity of the attacking liquid. This is achieved in the form of studs disseminated on the surface of the chip, constituting one or more open circuits. These open circuits will be closed by the spreading of the attacking liquid, due to the fluidity and conductivity thereof. The density of studs on the surface is variable and may reach a high value, thus totally preventing a liquid chemical attack.

There are two benefits to this last solution: the first benefit is that, since the chip is higher than the substrate in the housing, an attack on the housing would therefore a priori be detected earlier by the sensors located on the surface of the chip. The second benefit is that this mechanism also provides protection against physical ingression into the chip. It may ideally be used in addition to other mechanisms, such as lattices, which are commonly used nowadays.

Advantages of the Invention:

The method for protecting integrated circuits and the integrated circuits obtained according to the invention meet the set aims. The proposed solution using fragile elements in the vicinity of the sensitive areas makes it possible to counter practically all invasive attacks on the integrated circuits, regardless of the technologies used for these integrated circuits.

In addition, it makes it possible to reinforce the protection in the area of the housing of the integrated circuit, so as to have readily available and guaranteed security.

Furthermore, in some cases, for example when the fragile elements are made of epoxy resin, the tools for depositing the resin are already available and well-mastered, so that the use thereof for another function, namely that of depositing conductive droplets in order to create and close a detection circuit against ingression, can be envisaged with little cost and a high manufacturing yield.

Uses of the Invention:

In view of its multiple advantages, the described solution can be applied to integrated circuits intended for a wide range of applications, such as for example sensitive components for applications such as Voice over IP telephony, the transmission of confidential data on networks (authentication, VPN techniques), secure authentication tokens ("secure USB key"), components dedicated to security, components for cryptographic calculation.

We claim:

1. An electronic integrated circuit comprising an electronic chip (1) attached to a substrate (3), the assembly being protected by a housing, the electronic chip being provided with input/output studs (2) connected to linking pads (6) arranged on the substrate, this circuit being further provided with at least one ingression detection means (9, 10) capable of detecting a mechanical and/or chemical ingression inside the housing and/or an attempt to access a sensitive area of the integrated circuit, characterized in that said ingression detection means (9, 10) comprises a detection circuit (9) embedded in the substrate and/or placed at a different location on the substrate (3) from that of the integrated circuit, and arranged so as to pass in the immediate vicinity of some sensitive areas of the integrated circuit so that any attempt to access any one of said sensitive areas brings about a change in the electric state (closed/open) of said detection circuit (9).

2. The integrated circuit according to claim 1, characterized in that said detection circuit comprises fragile areas (10), arranged in the immediate vicinity of said sensitive areas, so that any physical or chemical access in the vicinity of a sensitive area brings about destruction of the adjacent fragile area (10) and detection of the ingression into the circuit.

3. The integrated circuit according to claim 2, characterized in that said fragile areas are embodied in the form of droplets (10) of conductive resin, arranged in the vicinity of said sensitive areas.

4. The integrated circuit according to claim 3, characterized in that the droplets (10) of conductive resin have a size smaller than approximately 1000 micrometers and are spaced apart from the sensitive areas to be protected by a spacing of around 50 micrometers.

5. The integrated circuit according to claims 2, characterized in that the fragile areas (10) of the detection circuit (9) are randomly distributed in the substrate (3) of the integrated circuit.

6. The integrated circuit according to any one of claims 1 to 4, characterized in that the substrate (3) comprises a conductive scatter pattern, in particular in the form of a grid, some joining points of the scatter pattern which are close to the sensitive areas being raised to the surface of the substrate by conductive feed throughs and provided with a fragile area (10).

7. The integrated circuit according to any one of the preceding claims, characterized in that the ingression detection circuit is arranged directly on the chip (2) instead of the substrate (3) or in addition thereto, the ingression detection circuit being connected to the input/output studs (2) of the chip.

8. The integrated circuit according to any one of claims 1 to 7, characterized in that the detection circuit is embodied in the form of a circuit which is electrically open in the vicinity of the sensitive areas, so that a chemical attack by a conductive liquid brings about the closing of the circuit in the vicinity of the sensitive areas and consequently the detection of the chemical attack.

9. The integrated circuit according to any one of claims 1 to 7, characterized in that the detection circuit is embodied in the form of a circuit which is electrically closed in the vicinity of the sensitive areas, so that a chemical attack by a conductive liquid brings about the opening of the circuit in the vicinity of the sensitive areas and consequently the detection of the chemical attack.

* * * * *